United States Patent [19]

Oikawa

[11] Patent Number: 5,318,665
[45] Date of Patent: Jun. 7, 1994

[54] METHOD FOR ETCHING POLYSILICON FILM

[75] Inventor: Kirokazu Oikawa, Tokyo, Japan

[73] Assignee: NEC Corporation, Tokyo, Japan

[21] Appl. No.: 865,034

[22] Filed: Apr. 7, 1992

[30] Foreign Application Priority Data

Apr. 22, 1991 [JP] Japan .................. 3-118114

[51] Int. Cl.$^5$ .................................. H01L 21/306
[52] U.S. Cl. ................... 156/643; 156/662; 437/233
[58] Field of Search ............... 156/643, 662; 437/233

[56] References Cited

U.S. PATENT DOCUMENTS

| | | | |
|---|---|---|---|
| 4,490,209 | 12/1984 | Hartman | 156/643 |
| 5,007,982 | 4/1991 | Tsou | 156/643 |
| 5,013,398 | 5/1991 | Long et al. | 156/643 |
| 5,160,407 | 11/1992 | Latchford et al. | 156/643 |

FOREIGN PATENT DOCUMENTS 328350 8/1989 European Pat. Off. .
350997 1/1990 European Pat. Off. .
0514013 11/1992 European Pat. Off. .
4-298035 10/1992 Japan .

OTHER PUBLICATIONS

L. Y. Tsou, "Highly Selective Reactive Ion Etching of Polysilicon with Hydrogen Bromide", *J. Electrochem. Soc.*, vol. 136, No. 10, Oct. 1989.

*Primary Examiner*—Brian E. Hearn
*Assistant Examiner*—Laura M. Holtzman
*Attorney, Agent, or Firm*—Burns, Doane, Swecker & Mathis

[57] ABSTRACT

In etching a polysilicon film having a large step difference by means of the RIE method, use is made of a mixed gas of HBr and Ar (10 to 25%) or a mixed gas of HBr, Ar (5 to 25 %), and $O_2$ (0.2 to 2%). With this arrangement, it is possible to eliminate the residuals in the step part, and etch the polysilicon film with high anisotropy with little etching of the underlying oxide film.

2 Claims, 2 Drawing Sheets

METHOD FOR ETCHING POLYSILICON FILM

BACKGROUND OF THE INVENTION

1. Field of the Invention

The present invention relates to an etching method for a polysilicon film, and more particularly, to a dry etching method for a polysilicon film formed during the manufacturing process of a semiconductor device.

2. Description of the Prior Art

In recent years, semiconductor devices are being designed with increasingly three-dimensional features in their structures, along with the enhancement of the degree of integration. Because of that, the processes for film formation in parts with large step difference are increasing in number. So far as the polysilicon films are concerned, one that is used as an electrode of a stacked capacitor for a dynamic random access memory (DRAM) is formed on underlying material having the large step difference. A method of forming the lower electrode of a stacked capacitor that uses a polysilicon film will be described as follows.

First, after forming a field oxide film with thickness of about 300 nm on a silicon substrate by a selective oxidation method, a wiring that is connected to a gate electrode is formed on one end of the field oxide film using a first polysilicon film with thickness of about 500 nm. Next, after forming all over the surface a 150 nm thick silicon oxide film as an interlayer insulating film, a 600 nm thick second polysilicon film which is to become a lower electrode is formed on top of it. At this time, a step difference of about 800 nm is generated in the second polysilicon film due to the roughness of the underlying material.

Next, the second polysilicon film on the field oxide film is masked with a photoresist film so as to have an end of the photoresist film to be situated on the wiring of the first polysilicon film, and the exposed part of the second polysilicon film is etched by the reactive ion etching (RIE) method. When the etching (namely, RIE, and similarly in the following) of the flat part of the second polysilicon film is completed, there is left a residue of the second polysilicon film on the side faces of the wiring because the second polysilicon film is being formed thick. In order to remove the residue of the second polysilicon film completely, an etching time which is about twice as long is required. The RIE method is principally employed for etching the polysilicon film, and a chlorofluorocarbon gas such as $CClF_3$, a bromochlorofluorocarbon gas such as $CClBrF_2$, and a gas consisting mainly of $Cl_2$ are frequently employed as the etching gas.

Further, the use of HBr gas as an etching gas for the polysilicon film based on its high selectivity with the oxide film formed on the semiconductor substrate and its high anisotropy has been reported by L. Y. Tsou in the Journal of the Electrochemical Society, Vol. 136, No. 10, 1989, p. 3003. In etching a polysilicon film using HBr gas, there is a case in which HBr gas alone is used or a case in which He is added to stabilize the plasma discharge. In either case, however, the selectivity of polysilicon to $SiO_2$, the ratio of the etching rate of the polysilicon film to the etching rate of the oxide film, is higher than 100.

However, the conventional etching gases for a polysilicon film described in the above, a chlorofluorocarbon gas such as $CCl_2F_2$ or a bromochlorofluorocarbon gas such as $CClBrF_2$ has a small selectivity with respect to the oxide film on the order of 20. Therefore, if the second polysilicon film is overetched in order not to leave etching residue, even the oxide film in the underlying base is etched, adversely affecting the formation of a source-drain diffused layer.

On the other hand, the use of $Cl_2$ gas makes it difficult to control the etching shape because of its small sidewall protective effect at the time of etching. Moreover, in order to carry out an anisotropic etching by the use of $Cl_2$ gas it is necessary to perform the etching at low pressure and the selectivity has to be lowered. Furthermore, since the $Cl_2$ gas even etches the photoresist film which is a mask, there is also a problem that a pattern formation with high accuracy cannot be obtained.

Finally, with the use of HBr gas, the selectivity with respect to the oxide film is a high value of over 100, and an etching with high anisotropy can be accomplished, but when the second polysilicon film is etched as in the above, a deposited film is formed on the side face parts of the wiring. Because of this, at the time of over etching filamentlike residuals are formed with this deposited film as a mask, becoming the cause of short-circuiting of the wiring or generation of dust and generating defects deteriorating the reliability of semiconductor device and the yield of manufacturing.

BRIEF DESCRIPTION OF THE INVENTION

Object of the Invention

It is an object of the present invention to provide a method for etching a polysilicon film having a large step difference by an RIE method which can retain an anisotropic shape of a polysilicon film beneath a mask and thoroughly eliminate residuals in the step part with hardly etching an underlying insulating film.

Summary of the Invention

This invention is characterized in that it uses as the etching gas for etching a polysilicon film having a step difference by the RIE method a mixed gas containing at least HBr and Ar or a mixed gas containing at least HBr, Ar, and $O_2$.

When a mixed gas of HBr and Ar is employed, the formation of filamentlike residuals in the step part which occurs in the conventional method can be avoided since the deposits formed in the step part can be removed by the knocking-off by the Ar ions at the time of etching. The gas flow of Ar to the total gas flow of the mixed gas to be supplied to the reaction chamber is desirable to be in the range of 10 to 25%. If it is higher than 25%, the selectivity with respect to the oxide film becomes smaller than 20, increasing the etched amount of the underlying oxide film. On the other hand, if it is smaller than 5%, it tends to generate filamentlike residuals in the step part.

When a mixed gas of HBr, Ar, and $O_2$ is employed, the selectivity of the polysilicon film relative to the oxide film is increased, and it becomes possible to reduce to a large extent the etched amount of the underlying oxide film when the polysilicon film is overetched. The gas flow of $O_2$ to the total gas flow of less than 2% is desirable, with the generation of filamentlike residuals in the step part if it is larger than 2%.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Next, referring to the accompanying drawings, an embodiment of the invention will be described.

Figure 1A:
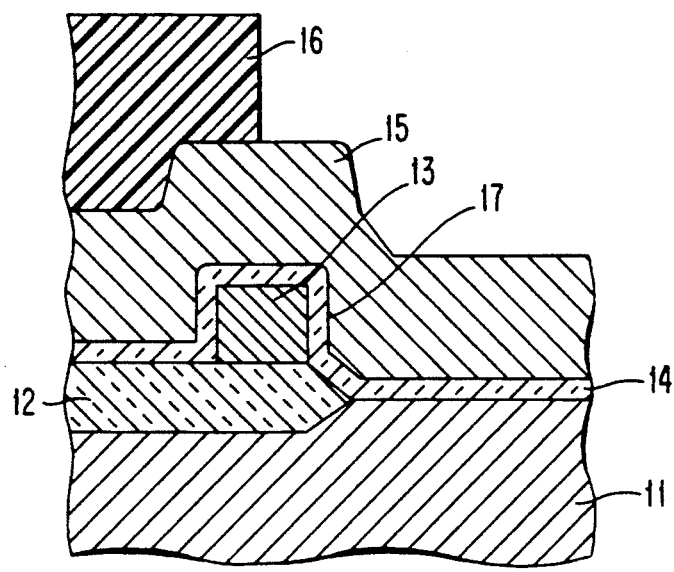
FIG. 1 is a sectional view of a semiconductor chip for describing a first embodiment of the invention.

First, as shown in FIG. 1(a), a field oxide film 12 with thickness of about 300 nm is formed on a silicon substrate 11. Next, after formation on the field oxide film 12 of a wiring 13 consisting of a first polysilicon film with thickness of 500 nm connected to a gate electrode, a 150 nm thick silicon oxide film 14 as an interlayer insulating film and a 600 nm thick second polysilicon film 15 which serves as the lower electrode of a capacitor are formed all over the surface. At this time, a step part 17 due to the wiring 13 and the like is formed on the side faces of the silicon oxide film 14. Then, after forming a photoresist film 16 all over the surface, the photoresist film 16 is patterned by photolithography.

Figure 1B:
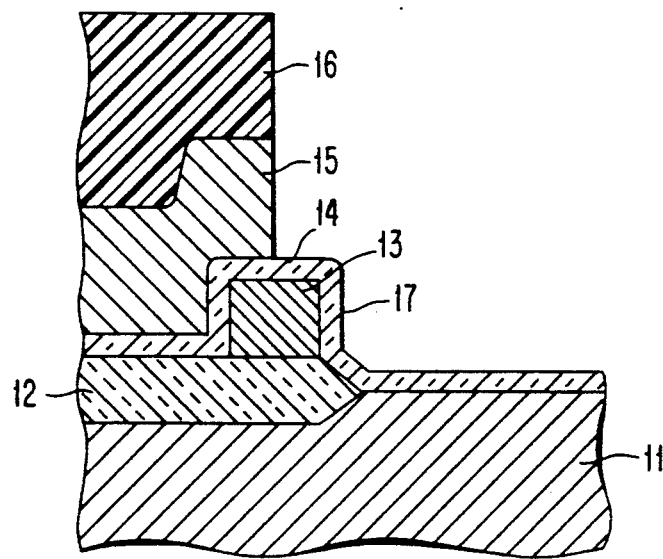

Next, as shown in FIG. 1(b), the second polysilicon film 15 is etched by an RIE method that uses a mixed gas of HBr, He, and Ar as the etching gas with the photoresist film 16 as the mask. The etching conditions were pressure of 250 m Torr, RF power of 250 W, HBr gas flow of 100 sccm, He gas flow of 80 sccm, and Ar gas flow of 20 sccm, and an overetching quantity of 150%. As a result of the over-etching of 150%, the second polysilicon film 15 in the step part 17 was completely removed, moreover, the reduction in the thickness of the underlying silicon oxide film 14 was less than 30 nm, obtaining a high selectivity with respect to the oxide film.

Moreover, by adding Ar gas having high mass number to the etching gas, the occurrence of deposits in the step part can be suppressed, so that there will not be formed filament-shaped residuals on the step part as was the case in the prior art. Furthermore, the high anisotropic etching property which is the characteristic of HBr will not be spoiled by the addition of Ar, so that it is possible to accurately carry out the desired etching without undercutting the second polysilicon layer 15 underlying the photoresist film 16.

The ratio of the gas flow, that is volume ratio of Ar to be added is desirable to be in the range of 5 to 25% of the total gas flow of the mixed gas. If the ratio is higher than 25%, then the selectivity with respect to the oxide film becomes smaller than 20, increasing the amount of reduction due to etching of the underlying oxide film. On the other hand, if it is smaller than 5%, there are generated filament-shaped residuals on the step part, though the selectivity with respect to the oxide film remains high.

Figure 2:
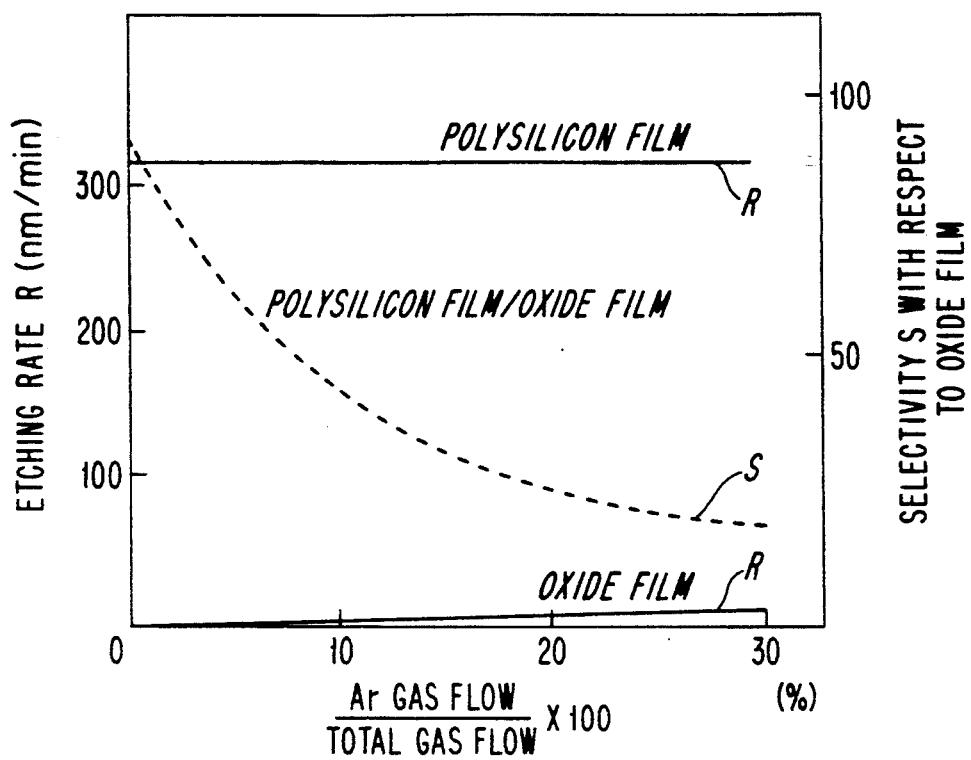
FIG. 2 is a diagram showing the dependence of the etching rate and of the selectivity with respect to the oxide film on the gas flow of Ar to the total gas flow.

The dependence of the etching rate R, and the dependence of the selectivity S of the polysilicon film with respect to the oxide film, on the ratio of Ar gas flow to the total gas flow are shown on the left-hand and the right-hand ordinates, respectively, in FIG. 2. As shown in FIG. 2, it can be seen that the selectivity with respect to the oxide film is higher than 20 when the Ar gas flow ratio is smaller than 25%. In addition, the etching rate of the polysilicon film is hardly changed even if the Ar gas flow ratio is varied.

It should be mentioned that although He is added to stabilize the plasma discharge in the first embodiment, an etching of the polysilicon film with approximately the same accuracy can also be obtained by the use of a mixed gas of HBr and Ar.

Next, a second embodiment of the invention will be described. The polysilicon film which is the object of etching is the second polysilicon film 15 shown in FIG. 1(a), being the same as in the first embodiment. In the second embodiment, a mixed gas of HBr, He, Ar, and $O_2$ was used as the etching gas. The etching conditions were a presure of 250 m Torr, RF power of 250 W, HBr gas flow of 100 sccm, He gas flow of 80 sccm, Ar gas flow of 20 sccm, $O_2$ gas flow of 1 sccm, and overetching quantity of 150%.

Figure 3:
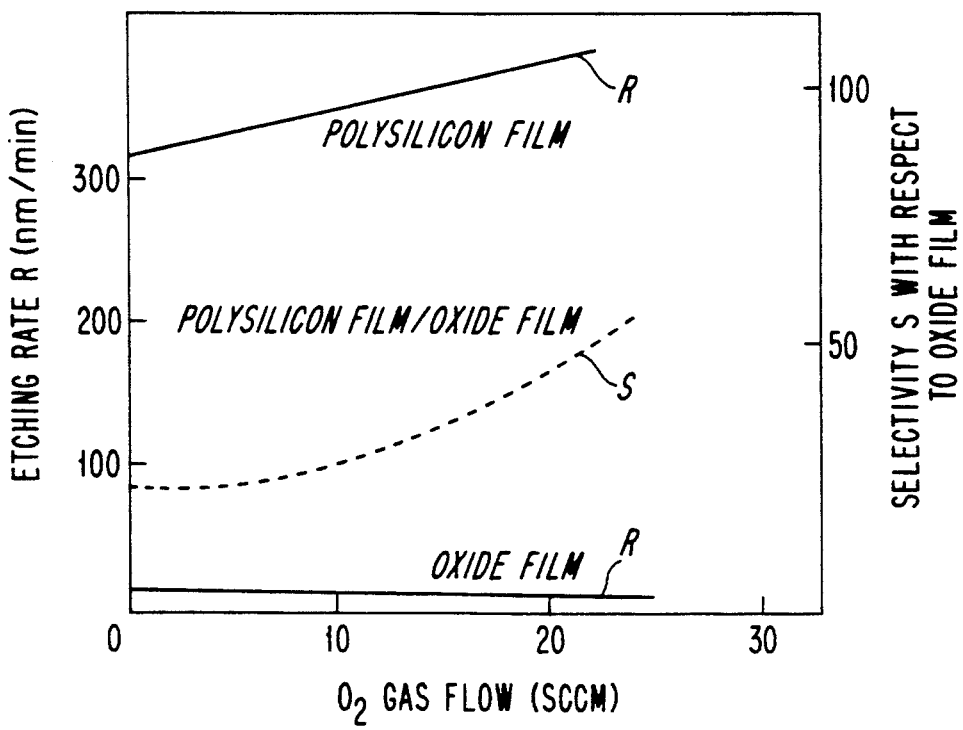
FIG. 3 is a diagram showing the dependence of the etching rate and of the selectivity with respect to the oxide film on the gas flow of $O_2$.

In the second embodiment, it was also possible to completely remove the second polysilicon film 15 in the step part 17, and accomplish a highly anisotropic etching. The gas flow of $O_2$ to be added to the etching gas is desirable to be in the range of 0.5 to 4 sccm, that is, less than 2% of the total gas flow. If $O_2$ is added in an amount more than 4 sccm, filamentlike residuals are generated on the step part. The dependence of the etching rate R, and the dependence of the selectivity of the polysilicon film with respect to the oxide film, on the gas flow of $O_2$ are shown on the left-hand and the right-hand ordinates, respectively, in FIG. 3. As can be seen from the figure, the etching rate of the polysilicon film is increased and the selectivity with respect to the oxide film becomes high with the addition of $O_2$, and it becomes possible to further reduce the etched amount of underlying oxide film compared with the first embodiment.

Although the invention has been described with reference to specific embodiments, this description is not meant to be construed in a limiting sense. Various modifications and applications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A method for etching a polysilicon film formed via an insulating film on the surface of a semiconductor substrate which underwent an impurity diffusion process by a reactive ion etching method that carries out ion etching in a reaction chamber having the atmosphere of an etching gas of a total gas flow, characterized in that said etching gas contains at least hydrogen bromide, argon, and oxygen.

2. An etching method for a polysilicon film as claimed in claim 1, wherein the ratio of gas flow of said argon is set to be in the range of 5 to 25% of said total gas flow and the ratio of said oxygen is set to be in the range of 0.2 to 2% of said total gas flow.

* * * * *

UNITED STATES PATENT AND TRADEMARK OFFICE
CERTIFICATE OF CORRECTION

PATENT NO. : 5,318,665
DATED : June 7, 1994
INVENTOR(S) : Hirokazu OIKAWA

It is certified that error appears in the above-identified patent and that said Letters Patent is hereby corrected as shown below:

On the title page,
item [75], delete "Kirokazu" and insert -- Hirokazu --.

Signed and Sealed this

Sixteenth Day of August, 1994

Attest:

BRUCE LEHMAN

Attesting Officer     Commissioner of Patents and Trademarks